Oct. 29, 1963 J. R. LIGENZA ET AL 3,108,915

SELECTIVE DIFFUSION TECHNIQUE

Filed June 30, 1961

INVENTORS J. R. LIGENZA
H. M. SHAPIRO

BY [signature]

ATTORNEY

United States Patent Office 3,108,915

Patented Oct. 29, 1963

3,108,915

SELECTIVE DIFFUSION TECHNIQUE

Joseph R. Ligenza, Westfield, and Herbert M. Shapiro, Somerville, N.J., assignors to Bell Telephone Laboratories Incorporated, New York, N.Y., a corporation of New York Filed June 30, 1961, Ser. No. 121,067
6 Claims. (Cl. 148—187)

This invention relates to a method for selectively heating a surface and is particularly useful in the fabrication of a diffused semiconductor device.

It is well known in the art that various surfaces are advantageously heated selectively for various purposes. For example, in the welding art metals are joined to one another by spot welding. Frequently the surfaces of mechanical piece parts are heated selectively for hardening load bearing portions. It is known that defects can be introduced selectively into a semiconductor crystal by ionic bombardment of the semiconductor surface for converting the conductivity of the affected region. Moreover, it is known that the selective electron bombardment of various organic films is a useful preparatory step in the processing of the film for the recording of information thereon. Diffusion into a semiconductor wafer is known to be caused by coating a semiconductor with a compound of a significant impurity and selectively heating the coating to diffusion temperatures by means of an electron beam. Although the invention has obvious diverse utility, it finds its most important use in the fabrication of diffused semiconductor devices.

In this application, the term "diffused semiconductor device" refers to a semiconductor device which includes at least one PN junction formed by exposing a portion of the surface of a semiconductor wafer of one conductivity type to a vapor of a significant impurity of the opposite conductivity type at an elevated temperature.

The characteristics of a diffused semiconductor device depend importantly on the depth and area of the diffused PN junction included therein. Accordingly, the problem of controlling the size and location of the diffused junction is of considerable importance and it is with respect to the solution of this problem that this invention has its most immediate application.

The present practice for controlling the area of the PN junction is to form a diffusion-resistant coating on the surface of the semiconductor wafer and subsequently to etch through portions of this coating preliminary to exposing the underlying semiconductor surface to the vapor of the significant impurity. Such a procedure is disclosed in Patent No. 2,802,760 issued August 13, 1957 to L. Derick and C. J. Frosch, and in our copending application, Serial No. 94,056 filed March 7, 1961.

An object of this invention is to diffuse a significant impurity selectively into a semiconductor wafer without the preliminary steps of forming and etching a diffusion-resistant coating.

This invention is based on the discovery that certain gases conveniently termed "dissociable gases" can be dissociated in the presence of radiation directed at a conveniently situated adsorbing surface and the atoms produced thereby will recombine selectively on shadowed portions of the surface. In this connection a "dissociable gas" is a molecular gas which can be dissociated into atoms and/or radicals by radiations. In this manner the heat or energy of recombination is transferred selectively to a shadowed portion which is thereby heated and rendered receptive to the diffusion of a significant impurity.

Accordingly, in one specific embodiment of this invention a surface of a P-type conductivity germanium semiconductor wafer is exposed at room temperature to a gaseous mixture of an arsenic compound and bromine gas. The arsenic compound serves as the source of arsenic which acts as the significant impurity to be diffused into the wafer. The bromine serves as the dissociable gas. Subsequently, the radiation of appropriate wavelength is directed in accordance with a desired pattern at the surface of the wafer for the diffusion of arsenic selectively only into the shadowed portion of the surface, converting those portions to N-type conductively to a depth dependent upon the energy and duration of the incident radiation.

Therefore, a feature of this invention is the inclusion in the gaseous mixture to which the wafer is exposed of a significant impurity and a dissociable gas for selectively actuating the diffusion process.

This invention, its objects, features and advantages will be understood more clearly from the detailed description rendered in connection with the following drawing, wherein.

Figure 1:
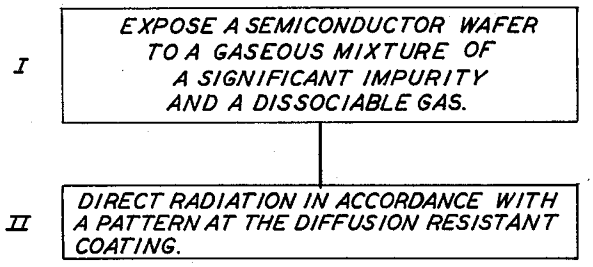
FIG. 1 is a flow diagram representing the steps of the method in accordance with this invention.

As will be apparent to one skilled in the art, the method for creating a localized diffused junction in a semiconductor wafer in accordance with this invention constitutes a considerable simplification over the methods of the prior art. Specifically, as indicated in FIG. 1, essentially only two steps are required. Step 1 requires the exposure of the semiconductor wafer to a gaseous mixture of the significant impurity which is to serve as the diffusant and a dissociable gas. Subsequently, as indicated in step 2, radiation in accordance with a pattern is directed at the wafer surface and the significant impurity diffuses into the wafer only at the shadowed portions of the wafer surface.

Figure 2:
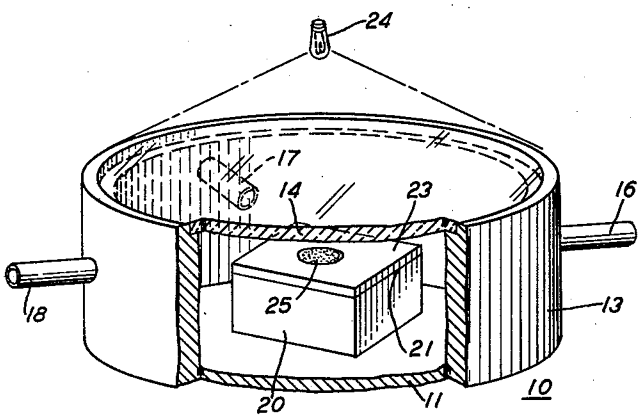
FIG. 2 is an arrangement for practicing the method of FIG. 1.

The apparatus of FIG. 2 has been found particularly convenient for the practice of the method of FIG. 1. The receptacle or enclosure 10 advantageously is cylindrical in shape having a disk-shaped portion 11 connected to one end of tubular portion 13 and a disk-shaped portion 14 detachably secured to the opposite end. Typically, the disk-shaped portion 14 comprises a material such as calcium fluoride transparent to the radiation employed and inert to the enclosed gases and the reaction products. Moreover, the remainder of the enclosure is fabricated from for example copper or quartz lined with platinum. Of course it is feasible to form such enclosure of other materials which are inert to the gases employed at the temperatures used.

Inlet 16 is connected to a supply (not shown) of the gaseous mixture; inlet 17 is connected to a supply (not shown) of an inert gas such as nitrogen used for flushing out the system prior to use in accordance with this invention. Outlet 18 is connected to a sink (not shown) for the disposal of the contaminated and unused gas.

A suitable starting material 20 such as a germanium wafer is positioned inside the receptacle 10. A major surface 21 of the starting material is positioned substantially parallel to the transparent disk portion 14. A mask 23 is positioned between the radiation source 24 and the surface 21. Portion 25, opaque to radiation, is provided in the mask for forming a pattern on surface 21. Advantageously, the shadowed area produced on surface 21 by opaque portion 25 is substantially less than (typically less than one-hundredth of) the area of the surface 21.

Typically, mask 23 is positioned beneath disk portion 14 substantially in contact with surface 21. In this case the mask is made of material such as calcium fluoride coated appropriately with a suitable opaque material which does not react with the gaseous ambient. The opaque portion can be formed by evaporating aluminum, in accordance with well known techniques. Means for maintaining the receptacle 10, the mask 23 and the radiation source 24 in spaced relation comprises well known support and clamping means (not shown).

Figure 3:
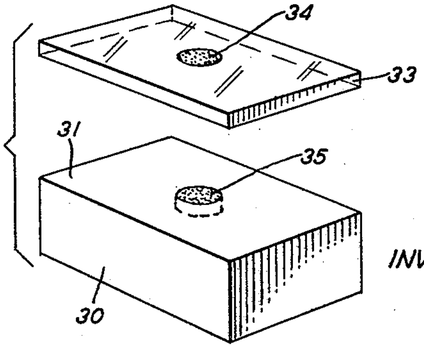
FIG. 3 is a schematic arrangement partially in cross section of a mask and typical diffused semiconductor wafer produced thereby in accordance with the method of FIG. 1.

In one example of the practice of this invention, the workpiece, such as a slice of germanium 30 shown in FIG. 3, is positioned within the receptacle approximately two inches from the radiation source which is, typically, a 100-watt high pressure mercury lamp. Mask 33 is positioned substantially in contact with surface 31 of the slice and is provided with at least one opaque aluminum portion 34 for delineating the desired diffusion pattern 35. A mixture of $AsBr_3$ and $Br_2$ is introduced to the receptacle at room temperature and atmospheric pressure. The radiation source is operated conveniently from a 250-watt transformer and the pattern 35 is formed in about ninety minutes.

The function of the dissociable gas is to heat selectively the shadowed portion of the semiconductor device. Accordingly, any such gas should be suitable to this end and the following table is included to indicate the heat produced by the energy of recombination of several dissociable gases in accordance with this invention.

TABLE I

| Dissociable gas: | Heat of recombination in kilocalories per mole |
|---|---|
| $H_2$ | 101 |
| $O_2$ | 128 |
| $Cl_2$ | 58 |
| $Br_2$ | 45.2 |
| $I_2$ | 35.12 |

Most of these gases are dissociated by radiation from an ordinary incandescent lamp. However, hydrogen and oxygen gas require radiation of a wavelength in the far ultraviolet range. Alternatively, the sensitizer mercury can be added to either the hydrogen or oxygen and radiation of around 2,537 angstrom units conveniently supplied by a mercury vapor lamp can be employed.

The recombination phenomenon is not observed unless there is present a surface to which the energy of recombination can be passed. Fortunately, the number of materials which provide surfaces suitable in this respect is large. A list of materials which are especially suitable in this respect includes semiconductor materials such as silicon and germanium, and other materials such as tungsten, tantalum, and certain oxides such as thoria.

The following appears to be an explanation of what has been observed to occur although applicants do not intend to be limited to such explanation. It is known that atoms can recombine and pass the energy or heat of recombination to a suitable surface only if the atoms first adsorb to the surface. Radiation from typical radiation sources generally energizes the dissociable gas to such an extent that the gas not only dissociates but at least one of the resulting atoms is raised to an excited state thereby. In addition, the atoms themselves adsorb radiant energy to enter even higher energy states. The atoms which diffuse (via the gas phase) into the shadowed areas are afforded an opportunity to give up some of their energy through fluorescence and subsequently acquiesce to adsorption forces at the shadowed portion of the surface. The atoms which remain in the irradiated areas do not have the opportunity to lose energy and, accordingly, are too energetic to adsorb to the irradiated portion of the surface. Since adsorption is a prerequisite for recombination, the latter occurs only in the shadowed portions of the surface.

The rate of energy delivered by the recombination of the atoms into the corresponding gas is substantially constant. However, the diffusion of the heat resulting from this recombination proceeds rapidly into the body of the wafer or workpiece. Accordingly, under prolonged exposure to radiation, the tendency is to elevate the entire body of the workpiece to a uniform temperature rather than elevating the temperature only of a restricted surface portion. This effect is avoided and the desired diffusion is obtained more selectively by employing interrupted incident radiation. In this connection, "pulsed radiation" is radiation interrupted at any convenient frequency, preferably for a period which allows a substantial restoration of the nonirradiated equilibrium condition.

Although other advantages are gained by employing interrupted or pulsed radiation, the primary advantage is that a high degree of resolution is insured because the heat produced by the recombination does not have an opportunity to diffuse into the illuminated portions of the surface. For example, diffused patterns having edges defined to within a fraction of a mil are possible. Moreover, shallow diffusions of impurities are made conveniently by this technique, if necessary, later to be diffused to greater depths by conventional heating means.

It is not necessary for the pattern forming mask to be in contact with the surface of the workpiece. In some instances contact is undesirable. For example, in the automation of a process in accordance with this invention, it may be desirable to position the slice 30 on a conveyor belt in which case contact between the mask and the slice would hinder the desirable relative motion. Similarly, it may be advantageous in certain instances to remove the mask from the receptacle 10 or merely to project an image at surface 31.

Although the invention is disclosed above in terms of germanium semiconductor material, other semiconductor materials can be used with the above disclosed or other dissociable gases such as the halogen acid gases for certain specific embodiments as will become evident below.

Specifically, the generic description of this invention encompasses three types of systems: (1) Halogen-halides; (2) hydrogen mercury-hydrides; and (3) halogen acids-halides. The test applied in determining the particular system apropos the desired end in accordance with this invention relates to the compatability of the dissociable gas and the significant impurity to be included therein. Another consideration involved in determining a specific embodiment within one of the three systems relates to the heat of recombination supplied by the dissociable gas as compared to the heat required to diffuse the impurity into the semiconductor material.

*(1) Halogen-Halides*

The designation of this particular system refers to the halogen acid gases and the halides of the significant impurity employed as the vapor source for the significant impurity. In order to reduce extraneous reactions and maintain a high degree of control over the main reaction and its products, it is desirable to minimize the number of chemicals employed. Accordingly, once a particular semiconductor material is selected there is typically a most desirable significant impurity which recommends itself. This significant impurity is usually available as a vapor of a compound of the impurity which has a low vapor pressure, therefore it is advantageous if the compound of the significant impurity also includes the element which constitutes the dissociable gas. Accordingly, for P-type germanium, the most convenient significant impurity is arsensic which is available as $AsBr_3$ (arsenic bromide) and a corresponding compatible dissociable gas is bromine. It is especially advantageous that a compound used to provide the significant impurity include the significant impurity and the element comprising the dissociable gas exclusively.

For P-type germanium starting materials the most desirable significant impurities are phosphorus, arsensic and antimony, all of which are available in the form of halides. Specifically, phosphorus is available in the form of $PCl_3$, $PBr_3$ and $PI_3$ with which $Cl_2$, $Br_2$ and $I_2$ gases are comptaible, respectively. Similarly, there are corresponding halides of arsenic and antimony.

The following is one example of the practice of the invention. A clean germanium wafer which is of P-type conductivity about .25 inch square by .050 inch thick and has a resistivity of 10 ohm-centimeters is positioned in the chamber of FIG. 2 and exposed to a gaseous mixture of $AsBr_3$ and $Br_2$. The mean operating temperature is typically about 45 degrees centigrade which is the result of heating by the radiation source. In certain embodiments heating may be undesirable and can be avoided conveniently by including in the apparatus a suitable heat sink. The vapor pressure of $AsBr_3$ and $Br_2$ at 45 degrees centigrade is one millimeter and 500 millimeters, respectively, and operation is essentially at such pressures. Exposure to radiation in accordance with a pattern from a Hanovia 500-watt mercury lamp (medium pressure) positioned approximately two inches from the wafer surface and pulsed at a rate of one minute on and one minute off over a 90 minute period produces at the shadowed portion of the wafer an arsensic diffusion to a depth of about 1,000 angstrom units and a degenerate surface.

From Table I it is seen that hydrogen and oxygen deliver a relatively high heat of recombination. However, the usefulness of oxygen is limited because it produces non-volatile oxides in many specific systems. Accordingly, oxygen preferably is used only with semiconductor materials which form volatile oxides at convenient processing temperatures. Hydrogen, then, is a more universally useful dissociable gas in accordance with this invention.

*(2) Hydrogen Mercury-Halides*

The significant impurity in this system is chosen compatible with hydrogen gas. Specifically, hydrogen is particularly useful with silicon which requires a relatively high diffusion temperature, typically 1,200 degrees centigrade. In one example of its use, a clean P-type conductivity silicon wafer approximately .25 x .25 x .050 inch having a restivity of about 10 ohm-centimeters is positioned in the enclosure of FIG. 2 and exposed to a gaseous mixture of phosphine ($PH_3$) and mercury (Hg) at about 50 degrees centigrade. A suitable process for cleaning silicon wafers typically removes any oxide coating which may have accumulated on the wafer surface. Under certain circumstances it may be desirable to retain the oxide coating as is discussed below. At this temperature, hydrogen, phosphine and mercury have vapor pressures of 100 millimeters, 10 millimeters and 10 millimeters, respectively. Radiation in accordance with a pattern from a 500-watt Hanovia (medium pressure) mercury lamp pulsed at a rate of one minute on and one minute off for 90 minutes produced a selective phosphorus diffusion of about 2,000 angstrom units deep and an N-type conductivity degenerate surface in the shadowed portions of the surface. The radiation source is held slightly less than two inches from the wafer surface. As was explained above, the mercury is employed to activate the hydrogen gas conveniently and required radiation of 2,537 angstrom units supplied by the lamp used.

*(3) Halogen Acids-Halides*

The halogen acid gases useful for this invention typically are hydrides of the halogen gases as for example HCl, HBr and HI which deliver heat of recombination as indicated in Table II.

TABLE II

| Halogen acid gas: | Heat of recombination in kilocarlories per mole |
|---|---|
| HCl | 130 |
| HBr | 97.5 |
| HI | 64.5 |

In this case, an etching reaction of the type disclosed in the application concurrently filed June 30, 1961 for J. R. Ligenza, Serial No. 83,273, is observed simultaneously with the diffusion. As one example, $PCl_5$ (phosphorus pentachloride) is employed as the source of phosphorus in a gaseous mixture also including HCl (hydrochloric acid). The vapor pressures of the $PCl_5$ and HCl were one millimeter and 100 millimeters, respectively. A clean P-type conductivity silicon wafer having the dimensions .25 x .25 x .050 inch is exposed to this gaseous mixture in the enclosure of FIG. 2. A 500-watt Hanovia (medium pressure) mercury lamp held less than two inches from the surface of the silicon wafer provides a processing temperature of about 55 degrees centigrade. Exposure to radiation in accordance with a pattern from the radiation source and under the pulsed conditions described above produced in about 90 minutes a weight loss indicating an etching of about 10,000 angstrom units and a residual phosphorus diffusion of about 500 angstrom units at the shadowed portion. If desired, such etching can be substantially reduced by retaining the film of silicon dioxide which naturally grows on the silicon surface when it is exposed to air. This oxide typically is 20–50 angstrom units thick and is not attacked by the halogen acids. Moreover, the film is sufficiently continuous to protect the silicon substrate from the halogen acid without inhibiting the diffusion process in any way.

The above described specific embodiments are susceptible to numerous and varied modifications, all clearly within the spirit and scope of the principles of the present invention, as will at once be apparent to those skilled in the art. No attempt has here been made to exhaust all such possibilities.

For example, although compatibility of the compound of the impurity and the dissociable gas is desirable, it is not a requirement in accordance with this invention. Specifically, the only requirement is that the reaction products be volatile at the reaction temperatures. Accordingly, various embodiments of this invention also are obtained with various combinations of compounds of impurities and "non-compatible" dissociable gases.

What is claimed is:

1. A method for diffusing selectively an impurity into a semiconductor wafer having a surface, said method comprising the steps of exposing said surface to a gaseous mixture including said impurity and a dissociable gas selected from the class consisting of $Br_2$, $Cl_2$, $I_2$, HBr, HCl, HI, $O_2$ and $H_2$ and in the absence of additional reactants and directing at said surface radiation in accordance with a pattern thus forming irradiated and shadowed areas on said surface, said radiation being of a wavelength to dissociate said dissociable gas and for a time to diffuse said impurity into the shadowed areas of said surface only.

2. A method for diffusing selectively a significant impurity into a semiconductor wafer, said method comprising the steps of exposing the surface of said wafer to a gaseous mixture including said impurity and a dissociable gas selected from the class consisting of $Br_2$, $Cl_2$, $I_2$, HBr, HCl, HI, $O_2$ and $H_2$ and in the absence of additional reactants, and directing at said surface pulsed radiation in accordance with a pattern thus forming irradiated and shadowed areas on said surface, said radiation being of a wavelength to dissociate said dissociable gas and for a time to diffuse said impurity into the shadowed areas of said surface only.

3. A method for diffusing selectively a significant impurity of one conductivity type into a semiconductor wafer including a significant impurity of the opposite conductivity type for forming a PN junction therein, said method comprising the steps of exposing the surface of said wafer to a gaseous mixture including said impurity and a dissociable gas selected from a class consisting of $Br_2$, $Cl_2$, $I_2$, HBr, HCl, HI, $O_2$ and $H_2$ and in the absence of additional reactants, and directing at said surface radiation in accordance with a pattern thus forming irradiated and shadowed areas on said surface, said radiation being of a wavelength to dissociate said dissociable gas and for a time to diffuse said impurity into the shadowed areas of said surface only for inverting the conductivity type of a surface portion of said surface.

4. A method in accordance with claim 3 wherein said semiconductor wafer comprises silicon.

5. A method in accordance with claim 3 wherein said semiconductor wafer comprises germanium.

6. A method for diffusing selectively a significant impurity into a semiconductor wafer, said method comprising the steps of exposing the surface of said wafer to a gaseous mixture including said impurity and a gas selected from the class consisting of $Br_2$, $Cl_2$, $I_2$, HBr, HCl, HI, $O_2$ and $H_2$ and in the absence of additional reactants, and directing at said surface intermittent radiation in accordance with a pattern thus forming irradiated and shadowed areas on said surface, said radiation being for a time to diffuse said impurity into the shadowed portion of said surface.

References Cited in the file of this patent

UNITED STATES PATENTS

| | | |
|---|---|---|
| 2,695,852 | Sparrs | Nov. 30, 1954 |
| 2,841,477 | Hall | July 1, 1958 |
| 2,946,708 | Berghaus | July 26, 1960 |

FOREIGN PATENTS

| | | |
|---|---|---|
| 1,056,899 | Germany | Aug. 19, 1955 |